United States Patent [19]

Dickson et al.

[11] Patent Number: 4,562,090

[45] Date of Patent: Dec. 31, 1985

[54] METHOD FOR IMPROVING THE DENSITY, STRENGTH AND BONDING OF COATINGS

[75] Inventors: James Dickson, Stirling, N.J.; Charles Hays, Pearland, Tex.

[73] Assignee: Gray Tool Company, Houston, Tex.

[21] Appl. No.: 556,291

[22] Filed: Nov. 30, 1983

[51] Int. Cl.[4] .......................... B05D 1/08; B05D 3/12
[52] U.S. Cl. .................................... 427/34; 427/331;
427/356; 427/370; 427/423; 427/437; 427/405;
204/37.1
[58] Field of Search ................. 427/34, 356, 370, 423,
427/191, 192, 248.1, 437, 405, 331; 204/37.1

[56] References Cited

U.S. PATENT DOCUMENTS

| | | | |
|---|---|---|---|
| Re. 28,301 | 1/1975 | Havel | 75/223 |
| 3,455,682 | 7/1969 | Barbaras | 25/204 |
| 3,469,976 | 9/1969 | Iler | 75/204 |
| 3,940,268 | 2/1976 | Catlin | 75/208 R |
| 4,145,481 | 3/1979 | Gupta et al. | 428/678 |
| 4,152,223 | 5/1979 | Wallace et al. | 204/37.1 |
| 4,171,562 | 10/1979 | Freeman et al. | 29/530 |
| 4,198,442 | 4/1980 | Gupta et al. | 427/34 |
| 4,317,850 | 3/1982 | Verburgh et al. | 427/370 |
| 4,327,154 | 4/1982 | Rossmann | 428/545 |
| 4,329,175 | 5/1982 | Turner | 75/208 R |
| 4,351,858 | 9/1982 | Hunold et al. | 427/370 X |
| 4,381,931 | 5/1983 | Hunold et al. | 65/18.1 |
| 4,381,943 | 5/1983 | Dickson et al. | 75/2.51 |
| 4,428,906 | 1/1984 | Rozmus | 419/98 |

OTHER PUBLICATIONS

*Metallic Glasses,* American Society for Metals, 1978, pp. 8–9.

*Metals Handbook,* 9th Ed., vol. 7, American Society for Metals, 1984, pp. 542–546.
Van Vlack, *Materials Science for Engineers,* Addison-Wesley Pub. Co., 1970, pp. 442–448.
*Metals Handbook,* 8th Ed., vol. 1, American Society for Metals, 1961, p. 8.
*Metals Handbook,* 9th Ed., vol. 3, American Society for Metals, 1980, p. 224.
*Webster's New Collegiate Dictionary,* pp. 13 and 94.
*Metals Handbook,* 1948 Edition, pp. 283–291.
Kelsey-Hayes High Performance Powder Metallurgy Technology, 1982.

*Primary Examiner*—Norman Morgenstern
*Assistant Examiner*—Bernard F. Plantz
*Attorney, Agent, or Firm*—Janine J. Weins; Michael J. Weins

[57] ABSTRACT

The method of the present invention improves the density, strength and bonding of coatings which have previously been applied to substrates by prior art methods such as chemical deposition, electrochemical processed, thermal deposition, and mechanical coating. The method of the present invention subjects the coated substrate to a thermal mechanical process in the form of a compressive stress which is applied to the coating at a temperature greater than about 0.5 $T_i$ and less than $T_i$ where $T_i$ is the incipient melting temperature. The compressive stress is preferably applied through a pressure transfer medium and should be greater in magnitude than about 30 ksi. The dwell time under maximum compressive stress can be from about 0.1 second to about 10 seconds depending on the temperature of the coating, the substrate and the magnitude of the compressive stress.

18 Claims, 9 Drawing Figures

100 μm

100 μm

100 μm

100 μm

METHOD FOR IMPROVING THE DENSITY, STRENGTH AND BONDING OF COATINGS

FIELD OF INVENTION

The present invention relates to a method for improving the density, strength and bonding of coatings previously applied to substrates.

BACKGROUND ART

Coatings are applied to substrates to provide a surface with particular properties such as wear resistance, corrosion resistance, and/or aesthetic appeal. The use of coatings can result in significant cost savings by allowing a substrate to be manufactured from an inexpensive material in a low cost manner while having the surface appearance and surface properties of the coating material. Common uses of coatings include silver plating of dining utensils, chromium plating of automobile trim, ceramic coatings on oil well stringer sections, wear resistant coatings on earth moving equipment, and the coating of metallic wellhead components to improve their heat, pressure, wear, erosion and corrosion resistance. Coatings can also be used to repair surfaces and thereby extend the life of a part.

A variety of different materials having a wide range of structures can be use to coat substrates. Coatings can be applied by a variety of techniques including chemical deposition; electrochemical processes such as electroplating; thermal deposition processes such as sputtering, vapor deposition, flame and plasma spraying; and mechanical coating processes such as dipping, rolling and painting. Coatings having uniform fine microstructure can be applied using techniques such as those discussed in U.S. Pat. No. 4,381,943 of Dickson et al.

The disadvantages of the prior art coating processes are that the coatings frequently are porous, have poor surface quality, contain defects and/or do not adhere well to the substrate. Porosity, poor surface quality and defects have an obvious aesthetic disadvantage, and in addition they may contribute to reduced strength and degradation in the properties of the coating such as the wear and corrosion resistance. If coatings are not well bonded they may spall or flake during thermal cycling, mechanical wear, exposure to chemicals and/or they may flake when the coated parts are deformed. Additionally poor bonding of the coating to the substrate may lead to accelerated and/or preferential corrosion at the coating substrate interface.

After application of a coating using prior art techniques porosity, coating density and bonding may be improved by thermal fusion, sintering, HIP'ing and/or peening. These techniques are costly and if the coating and substrate have different coefficients of thermal expansion rapid or excessive heating or cooling may cause the coating to separate from the substrate.

SUMMARY OF INVENTION

An object of the present invention is to provide high density coatings having a high degree of bonding to their substrates.

Another object of the present invention is to provide a method of producing coatings with fine microstructure.

Another object of the present invention is to provide a method for repairing worn parts and rebuilding subsize parts through the application of bonded material.

A further object of the present invention is to apply coatings which have seen limited time at temperature and thereby limit microstructural changes in the coating, interface, and/or substrate.

Another object of the present invention is to provide a relatively low cost method of improving the metallurgical bonding and density of coatings.

These and other objects of the present invention will become apparent from the following figures, description and examples.

The method of the present invention improves the density, strength and bonding of coatings which have previously been applied to a substrate. The method of the present invention can be used for coatings which have been chemically, electrochemically, thermally and/or mechanically applied to a substrate.

The present invention in its most general form requires that after a coating is applied to a substrate the coating be subjected a thermal mechanical process. This thermal mechanical process being a compressive stress applied to the coating at a temperature greater than about 0.5 $T_i$ and less than $T_i$ where $T_i$ is the absolute incipient melting temperature of the coating, interface and substrate; the incipient melting temperature being the highest temperature at which all components of the microstructure maintain their solid character.

The compressive stress should be applied through a pressure transfer medium. Generally the compressive stress should be greater than about (30,000 psi). The minimum compressive stress will be limited by the coating and the temperature at which the stress is applied. The upper limit on the compressive stress will be dependent on the equipment and the deformation characteristics of the coating and substrate.

The dwell time of the maximum compressive stress will vary from less than 0.1 second to about 10 seconds depending on the temperature of the coating, the substrate, the equipment and the magnitude of the stress.

BEST MODE FOR CARRYING THE INVENTION INTO PRACTICE

Figure 1:
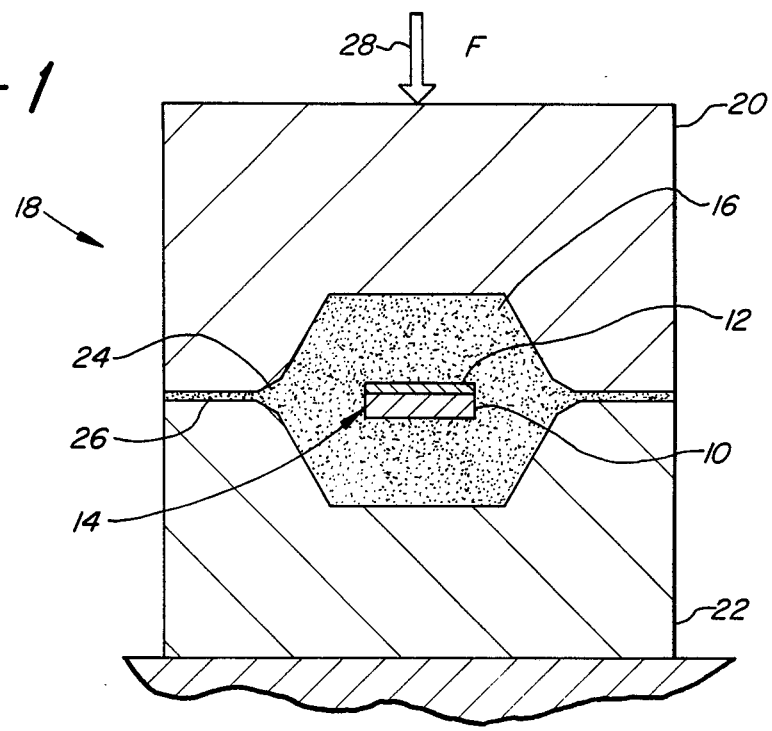
FIG. 1 is a schematic representation of a system for the application of a compressive stress to a coated substrate in accordance with one embodiment of the present invention.

The present invention in its simplest form requires that a previously applied coating be subjected to a thermal mechanical process in the form of a compressive stress applied to the heated coating. The compressive stress is transmitted to the coating by a yielding viscoelastic pressure transfer medium. For application of the compressive stress the pressure transfer medium is contained within a die and the die is impacted.

The coating should be at a temperature above about 0.5 $T_i$ and less than $T_i$ during application of the maximum compressive stress. The temperature range of 0.5 $T_i$ to 0.8 $T_i$ is preferred since this temperature range will limit grain growth, crystallization, recrystallization, diffusion and/or structural transformations within the coating and substrate. It is further preferred if the coating is a highly stable amorphous composition that the temperature of the coating not exceed $T_c$ where is $T_c$ is the absolute crystallization temperature so that the compressed coating remains highly amorphous. For amorphous materials $T_c$ is the temperature at which the amorphous material will crystallize.

The pressure transfer medium, which transmits the compressive stress to the coating, should be a viscoelastic material at the temperature at which the maximum compressive stress is applied. Materials which can be used for the pressure transfer medium include fused salts, metals near their melting point, glasses near their softening temperature, salts and glass, elastomers, and composites of glass frit, hydrous aluminum silicates, and ceramics. The pressure transfer medium should preferably be inert with respect to the coated substrate.

The maximum compressive stress should preferably be between about 30 ksi and 250 ksi depending on the coating, the substrate, the temperature of the coating during application of the compressive stress and the dwell time of the maximum compressive stress. The higher the compressive stress the lower the temperature to which the coating need be heated and/or the shorter the required time at maximum stress. It is preferred to utilize a relatively higher compressive stress and a relatively lower temperature since this will result in minimum microstructual changes and allow for maximum throughput.

During the time the coating is subjected to the maximum compressive stress will be a function of the magnitude of the stress, the temperature, the transfer medium and the equipment used. When the coating is a high strength material a longer dwell time at maximum compressive stress will generally be required. The dwell time will generally be reduced as the stress and/or the temperature are increased for a given coating and substrate.

The coating may be either heated prior to or during application of the compressive stress. Heating can be accomplished by placing the coated parts in a conventional furnace, or an induction furnace may be employed to quickly and preferential heat the coating and/or the surface of the substrate directly beneath the coating if either or both inductively couple. Since the method of the present invention does not require heating the entire substrate it is possible to adhere dense coatings to substrates while maintaining the desired microstructural characteristics of the substrate.

In a preferred embodiment of the present invention an isodynamic compression is applied to the heated coated substrate. The coated substrate is surrounded by a pressure transfer medium. The pressure transfer medium is contained within a closed die. The closed die is impacted by a conventional press. The time at temperature for a given compressive stress need only be sufficient to maintain the coating at the desired temperature during the application of the maximum isodynamic compression and thereby microstructural changes can be limited. Since the method of the present invention does not require the coated substrate be maintained at elevated temperatures for extended periods of time energy can be conserved which can result in cost savings.

The method of the present invention can be used to densify and bond coatings to any of a variety of substrates having a wide range of configurations. Among the materials which can be utilized for the substrate are low and high alloy steels, stainless steels, iron-nickel alloys, nickel, cobalt, copper base alloys and other nonferrous alloys. The method of the present invention can be utilized for renovation of a worn surface or to rebuild subsize parts.

Coatings subjected to the method of the present invention can include high wear and corrosion resistant nickel and chromium alloys, iron, nickel or cobalt base amorphous or microcrystalline alloys, and wear resistant oxide, boride and/or carbide containing alloys. The coatings can be applied to the substrate by any of the prior art coating processes including arc plasma spraying, electrochemical deposition, dipping, painting, vapor deposition and ion implantation. In addition since the method of the present invention densifies and bonds the coating, low density coatings can be applied utilizing techniques that result in relatively poor adhesion such as overlaying the substrate with ribbon, wool or cloth which is impervious to the pressure transfer medium.

The coating can be any reasonable thickness and multiple layer coatings can be applied. The individual layers of a multiple layer coating can be of different materials or of the same material. The lower limit on the thickness will generally be about 12.5 μm, but can be as low as practical for the subsequent application. The maximum thickness of the coating is limited not by the process of the present invention, but rather by the deposition technique, the coating material, and the intended use of the coated substrate.

FIG. 1 is a schematic representation of a system for the application of a compressive stress to a coated substrate in accordance with the method of the present invention. The substrate 10 has a coating 12 which has been applied by the utilization of an appropriate prior art coating technique. The coated substrate 14 is surrounded by a pressure transfer medium 16 such as a mixture of clay and glass frit. The pressure transfer medium 16 is constrained by a configured die 18 having an upper movable die segment 20 and a lower stationary die segment 22. A flash gutter 24 is provided at the interface 26 between the upper movable die segment 20 and the lower stationary die segment 22. A compressive stress is applied to the coated substrate 14 by the application of a compressive force 28. The compressive force 28 may be applied to the die 18 by a conventional hydraulic or mechanical forging press not shown.

Figure 2:
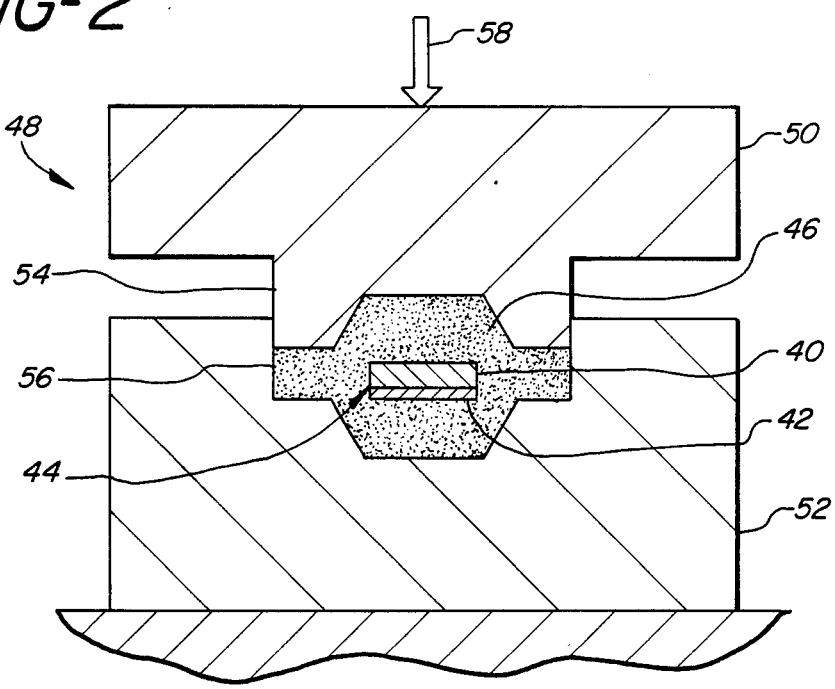
FIG. 2 is a schematic representation of a system for the application of an isodynamic compression to a coated substrate in accordance with a second embodiment of the present invention.

FIG. 2 is a schematic representation of a system for the application of a compressive stress to a coated substrate in accordance with a second embodiment of the present invention. The substrate 40 has a coating 42 which has been applied by the utilization of an appropriate prior art coating process. The coated substrate 44 is surrounded by a pressure transfer medium 46 such as a mixture of clay and glass frit. The pressure transfer medium 46 is constrained by a configured closed die 48, having an upper movable die segment 50 and a lower stationary die segment 52. The wall 54 of the upper movable die segment 50 maintains sliding contact with the wall 56 of the lower stationary die segment 52. A compressive stress is applied to the coated substrate 44 by the application of a compressive force 58. This compressive force 58 may be applied to the closed die 48 by a conventional hydraulic or mechanical press not shown.

The following examples are offered to illustrate the method of the present invention and the advantages resulting from use of the method of the present invention.

EXAMPLE I

A powder having the particle size range given in Table 1 and the nominal composition $Ni_{57.5}Mo_{23.5}Fe_9B_{10}$ by atomic percent was deposited onto an AISI 316 stainless steel substrate by arc plasma spraying. Prior to deposition of the coating the surface was prepared by grit blasting. The substrate was not pre-heated prior to coating.

TABLE 1

| Particle Size Range Tyler Mesh | Percent in Range size by Weight |
| --- | --- |
| −80 +100 | 15 |
| −100 +270 | 65 |
| −270 +325 | 15 |
| −325 | 5 |

The arc plasma spraying was done under the following conditions:
Torch: AVCO PG-100 M
Work Distance Torch to Target: 4 inch
Power: 15.5 KW
Arc Gas: Argon, 40 cfh, Helium 10 cfh
Powder Gas Flow Rate: 10 cfm Argon
Orifice Gas flow velocity: 800 fps (0.7 Mach)
Thickness as deposited: 7 to 11 mils (nominal)

Figure 3:
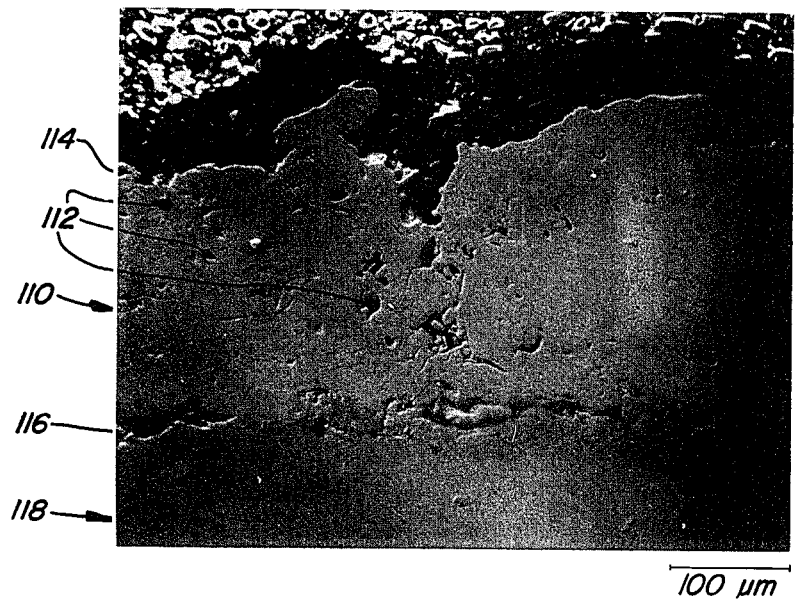
FIG. 3 is an electronmicrograph of an arc plasma coated steel substrate was which HIP'ed at 1950° F. in accordance with the prior art.

After deposition of the coated part was HIP-ed at 1950° F. under the following conditions:
Pressure: 15000 psi
Gas Medium: Argon
Time at Pressure: 4 hours
Cooling: Furnace cooled FIG. 3 is an electronmicrograph of a cross section of the steel part which was coated and subjected to HIPing at 1950° F. in accordance with the above described method. The coating 110 shows porosity 112 and an irregular porous surface 114. The interface 116 exhibits poor bonding between the coating 110 and the substrate 118.

EXAMPLE II

The alloy powder of Example I was arc plasma sprayed onto an AISI 4140 low alloy steel coupon which was nominally 4 inches × 4 inches × 0.375 inches thick. The arc plasma spraying was done under the same conditions as in Example I.

Figure 4:
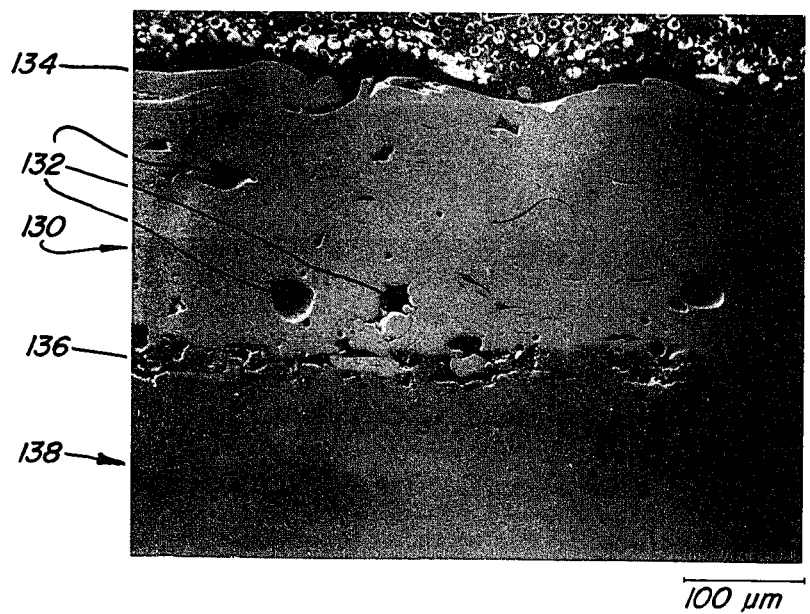
FIG. 4 is an electronmicrograph of an as coated steel substrate which was arc plasma sprayed with powder at a subsonic velocity of 800 fps, or 0.7 Mach.

FIG. 4 is an electronmicrograph of a cross section of the as coated steel coupon which was coated at subsonic velocity in the manner described above. The coating 130 shows porosity 132 and an irregular porous surface 134. The interface 136 exhibits poor bonding between the coating 130 and the substrate 138.

Figure 5:
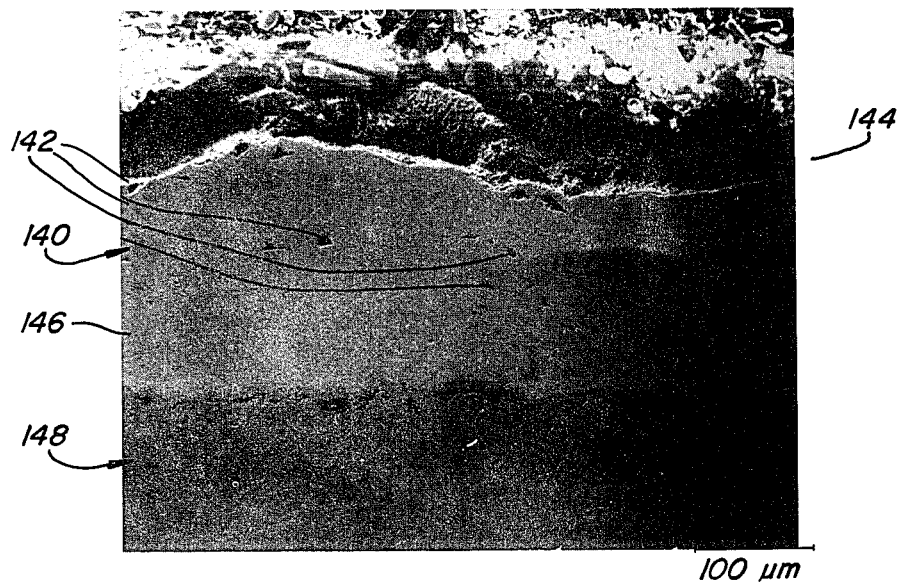
FIG. 5 is an electronmicrograph of another section of the coated steel substrate shown in FIG. 4. After coating this section was subjected to isodynamic compression at 1950° F. in accordance with one embodiment of the present invention.

After deposition a portion of the coupon was subjected to an isodynamic compression at 1950° F. in accordance with the method of the present invention. The isodynamic compression was done under the following conditions:
Pressure: 60 TSI (120,000 psi)
Pressure Transfer Medium: $SiO_2 + Al_6Si_2O_{13}$
Time at Pressure: 0.5 seconds FIG. 5 is an electronmicrograph showing a cross section of a portion of the coated steel coupon after this portion of the coupon has been subjected to isodynamic compression at 1950° F. in accordance with the above described method. The coating 140 shows fewer and smaller pores 142. The coating 140 has a more regular surface 144 than does the as coated coupon shown in FIG. 4. A better interface 146 can be observed between the coating 140 and the substrate 148 than was observed for the as coated coupon shown in FIG. 4.

EXAMPLE III

The alloy powder of Example I was arc plasma sprayed onto an AISI 4140 low alloy steel coupon which was nominally 4 inches × 4 inches × 0.375 inches thick. The arc plasma spraying was done under the same conditions as in Example I with the exception that the orifice gas flow velocity was 1200 fps (1.1 Mach).

Figure 6:
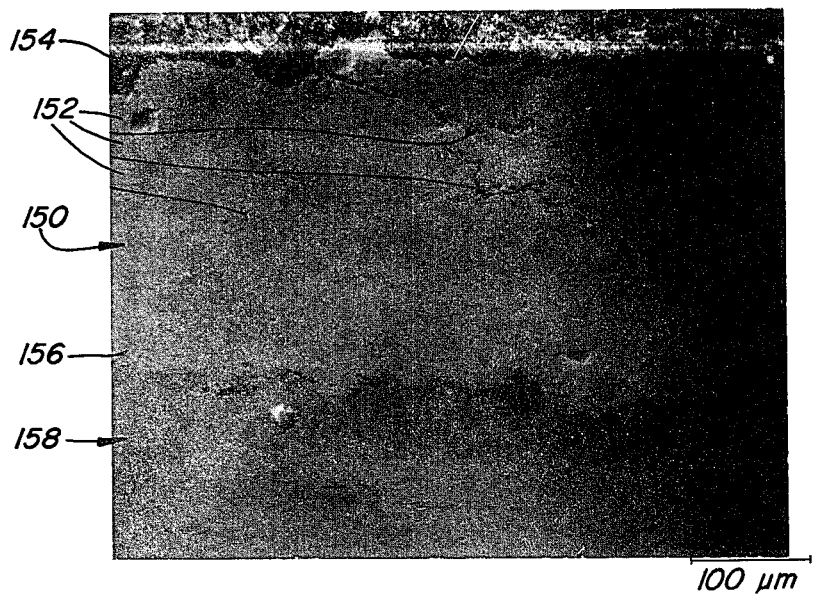
FIG. 6 is an electronmicrograph of an as coated steel substrate which was arc plasma sprayed with powder at the near sonic velocity of 1200 fps, or 1.1 Mach.

FIG. 6 is an electonmicrograph of a cross section of the as coated steel coupon which was coated at near sonic velocity in the manner described above. The coating 150 shows some small porosity 152 and an irregular porous surface 154. The interface 156 exhibits discontinuous bonding between the coating 150 and the substrate 158.

After deposition a portion of the coupon was subjected to an isodynamic compression at 1950° F. in accordance with the method of the present invention. The isodynamic compression was done under the same conditions as for Example II.

Figure 7:
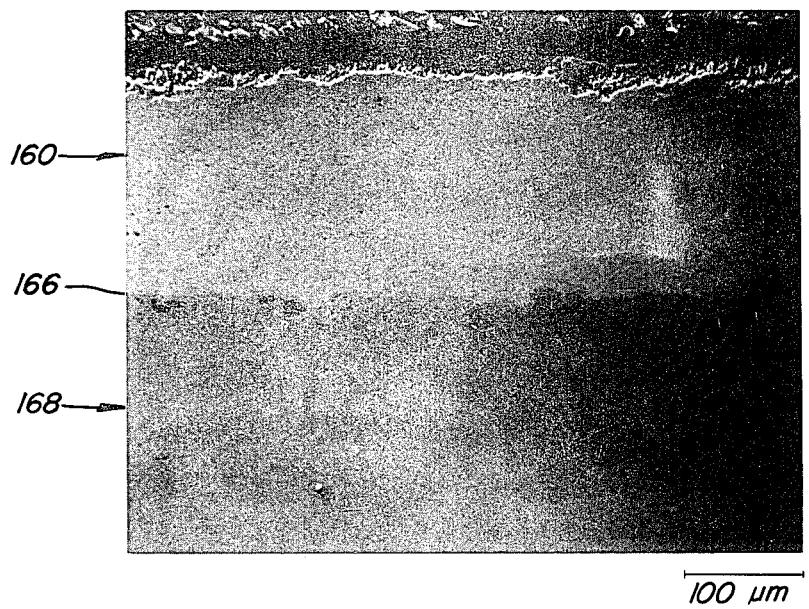
FIG. 7 is an electromicrograph of another section of the coated steel substrate shown in FIG. 6. After coating this section was subjected to isodynamic compression at 1950° F. in accordance with one embodiment of the present invention.

FIG. 7 is an electronmicrograph showing a cross section of a portion of the coated coupon after this portion of the coupon has been subjected to isodynamic compression at 1950° F. in accordance with the above described method. The coating 160 shows significantly reduced porosity and a better interface 166 between the coating 160 and the substrate 168 than is shown in FIG. 6 for the as coated coupon.

EXAMPLE IV

The alloy powder of Example I was arc plasma sprayed onto an AISI 4140 low alloy steel coupon which was nominally 4 inches × 4 inches × 0.375 inches thick. The arc plasma spraying was done under the same conditions as in Example I with the exception that the orifice gas flow velocity was 2000 fps (1.7 Mach).

Figure 8:
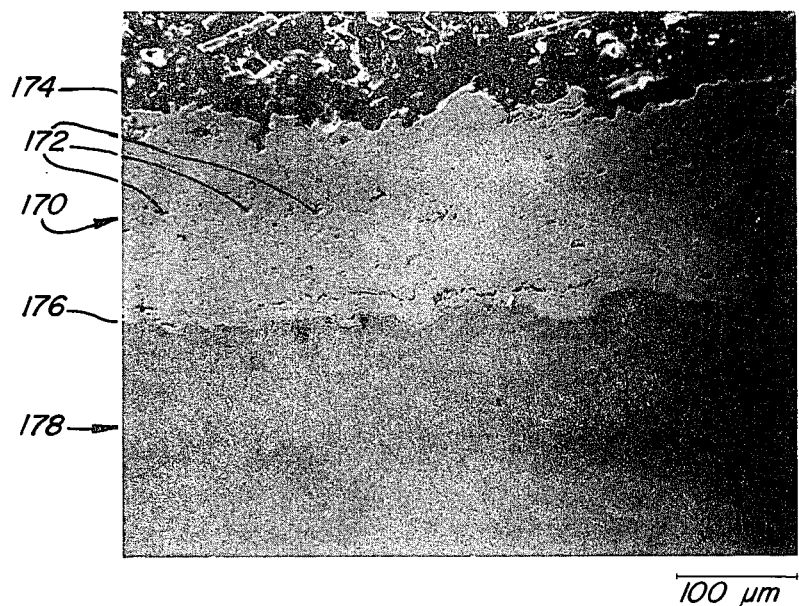
FIG. 8 is an electronmicrograph of an as coated steel substrate which was arc plasma sprayed with powder at the supersonic velocity of 2000 fps, or 1.7 Mach.

FIG. 8 is an electronmicrograph of a cross section of the as coated steel coupon which was coated at supersonic velocity in the manner described above. The coating 170 shows porosity 172 and an irregular porous surface 174. The interface 176 between the coating 170 and the substrate 178 contains some fine porosity.

After deposition a portion of the coupon was subjected to an isodynamic compression at 1950° F. in accordance with one embodiment of the present invention. The isodynamic compression was done under the same conditions as in Example II.

Figure 9:
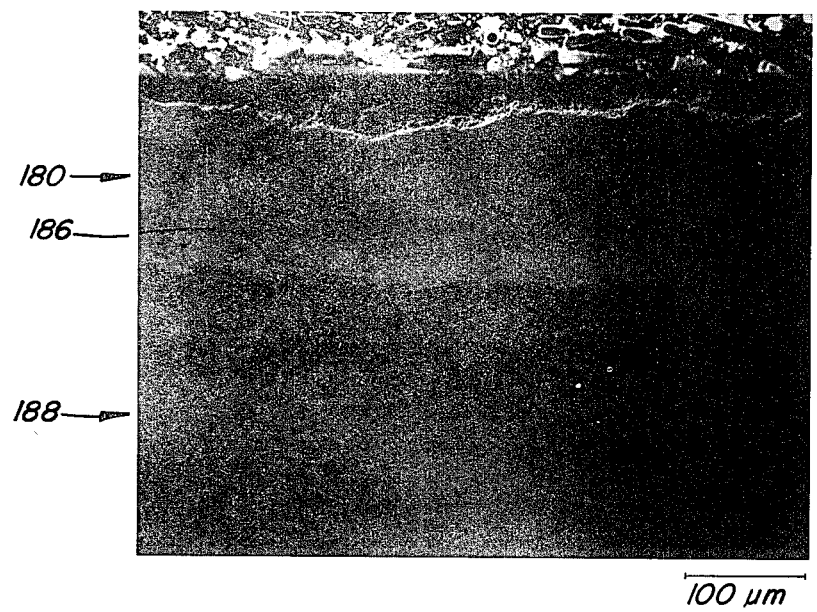
FIG. 9 is an electronmicrograph of another section of the coated steel substrate shown in FIG. 8. After coating this section was subjected to isodynamic compression at 1950° F. in accordance with one embodiment of the present invention.

FIG. 9 is an electronmicrograph showing a cross section of a portion of the coated coupon after this portion of the coupon has been subjected to isodynamic compression at 1950° F. in accordance with the above described method. The coating 180 shows reduced porosity and a good interface 186 between the coating 180 and the substrate 188 can be observed.

EXAMPLES V–VII

Sections of the as coated coupons of Examples II through IV were subjected to isodynamic compression in accordance with the method described in Example II with the exception that the isodynamic compression was done at 1850° F. The isodynamic compression at 1850° F. reduced the porosity and increased the bonding of the coating to the substrate.

While the novel features of this invention have been described in terms of preferred embodiments and particular applications, it will be appreciated that various omissions and substitutions in form and in detail of the apparatus and method may be made by those skilled in the art without departing from the spirit of the invention.

What we claim is:

1. A method for improving the density and bonding of a coating which has been previously applied to a substrate comprising the steps of:
   (a) heating the coating to a temperature above $0.5\, T_i$, where $T_i$ is the incipient melting temperature of the coating;
   (b) contacting the coated substrate with a pressure transfer medium, said pressure transfer medium being viscoelastic at the temperature to which the coating is heated;
   (c) enclosing the coated substrate and said pressure transfer medium in a die; and
   (d) applying a force to said die sufficient to cause a compressive stress greater in magnitude than 30 ksi to be applied through said pressure transfer medium and directly transmitted to said coated substrate.

2. The method of claim 1 wherein said temperature is between about $0.5\, T_i$ and $0.8\, T_i$, where $T_i$ is the incipient melting temperature of the coating.

3. The method of claim 1 wherein said pressure transfer medium is contained in a closed die.

4. The method of claim 1 wherein said compressive stress is less than 250 ksi.

5. The method of claim 1 wherein said compressive stress is further restricted to between about 150 and 200 ksi.

6. The method of claim 1 wherein the coating is amorphous and said temperature is below $T_c$, where $T_c$ is the glass transition temperature.

7. The method of claim 3 wherein the coating is amorphous and said temperature is below $T_c$, where $T_c$ is the glass transition temperature.

8. The method of claim 1 wherein said compressive stress is maintained for a time not greater than 10 seconds.

9. The method of claim 8 wherein the previously applied coating has been applied by a thermal deposition techniques from the group of techniques consisting of arc plasma spraying and flame spraying.

10. The method of claim 8 wherein said coating is applied by chemical deposition.

11. The method of claim 8 wherein said coating is applied by electrochemical deposition.

12. The method of claim 3 wherein the previously applied coating has been applied by a thermal deposition techniques from the group of techniques consisting of arc plasma spraying and flame spraying.

13. The method of claim 3 wherein said coating is applied by chemical deposition.

14. The method of claim 3 wherein said coating is applied by electrochemical deposition.

15. The method of claim 1 wherein the coating is comprised of multiple layers of different materials.

16. The method of claim 3 wherein the coating is comprised of multiple layers of different materials.

17. The method of claim 1 wherein said coating has been previously applied to a protruding surface of the substrate.

18. The method of claim 1 wherein said coating has been previously applied to a recessed surface of the substrate.

* * * * *